(12) United States Patent
Rumbolt et al.

(10) Patent No.: US 8,359,518 B2
(45) Date of Patent: Jan. 22, 2013

(54) 2D PRODUCT CODE AND METHOD FOR DETECTING FALSE DECODING ERRORS

(75) Inventors: Chuck Rumbolt, St. John's (CA); Wally Haas, St. John's (CA)

(73) Assignee: Altera Canada Co., Halifax, NS (CA)

( * ) Notice: Subject to any disclaimer, the term of this patent is extended or adjusted under 35 U.S.C. 154(b) by 333 days.

(21) Appl. No.: 12/702,659

(22) Filed: Feb. 9, 2010

(65) Prior Publication Data

US 2011/0099452 A1   Apr. 28, 2011

Related U.S. Application Data

(60) Provisional application No. 61/255,271, filed on Oct. 27, 2009.

(51) Int. Cl.
  *H03M 13/00* (2006.01)
  *H03M 13/03* (2006.01)

(52) U.S. Cl. .......... 714/755; 714/785; 714/786

(58) Field of Classification Search .......... None
See application file for complete search history.

(56) References Cited

U.S. PATENT DOCUMENTS

| | | | | |
|---|---|---|---|---|
| 6,681,362 | B1 * | 1/2004 | Abbott et al. | 714/755 |
| 6,810,499 | B2 | 10/2004 | Sridharan et al. | |
| 7,296,212 | B1 * | 11/2007 | Hammons, Jr. | 714/781 |
| 7,404,133 | B2 | 7/2008 | McClellan et al. | |
| 7,415,658 | B2 * | 8/2008 | Linkewitsch | 714/779 |
| 7,443,785 | B2 | 10/2008 | Bloebaum | |
| 8,132,087 | B2 * | 3/2012 | Linkewitsch | 714/801 |
| 2002/0049947 | A1 * | 4/2002 | Sridharan et al. | 714/752 |
| 2010/0241926 | A1 * | 9/2010 | Wang et al. | 714/758 |
| 2012/0137196 | A1 * | 5/2012 | Linkewitsch | 714/782 |

* cited by examiner

*Primary Examiner* — Guerrier Merant
(74) *Attorney, Agent, or Firm* — Ropes & Gray LLP

(57) ABSTRACT

The present invention discloses a method and apparatus for performing forward error correction with a multi-dimensional Bose Ray-Chaudhuri Hocquenghem (BCH) product code, and a method for detecting false decoding errors in frame-based data transmission systems.

20 Claims, 4 Drawing Sheets

FIG. 1
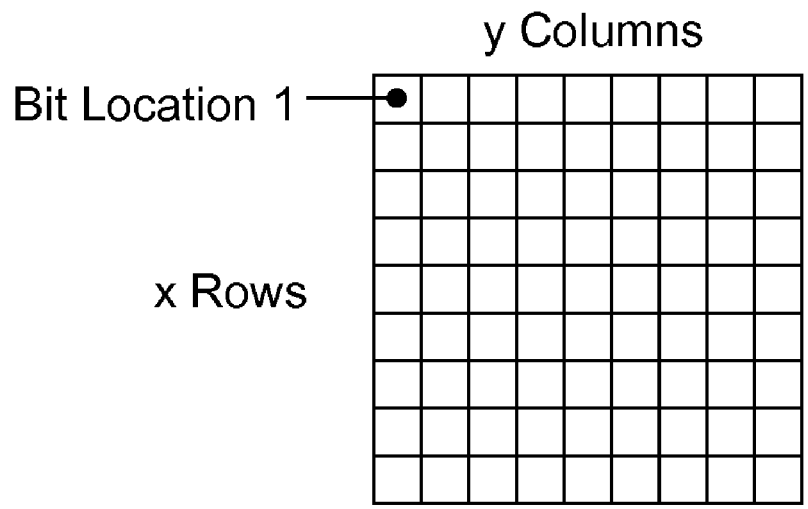
FIG. 2
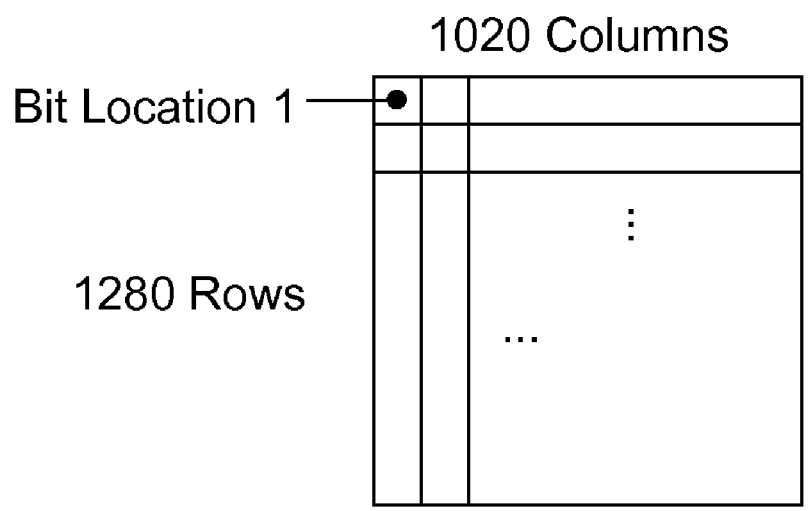
FIG. 3
| Row 1 | Row 2 | ... | Row 1280 |

2D PRODUCT CODE AND METHOD FOR DETECTING FALSE DECODING ERRORS

PARENT CASE TEXT

Priority is claimed to U.S. Provisional Application No. 61/255,271, filed 27 Oct. 2009.

CROSS-REFERENCE TO RELATED APPLICATIONS

Not Applicable

STATEMENT REGARDING FEDERALLY SPONSORED RESEARCH OR DEVELOPMENT

Not Applicable

REFERENCE TO A SEQUENCE LISTING, A TABLE, OR A COMPUTER PROGRAM LISTING COMPACT DISC APPENDIX

Not Applicable

BACKGROUND OF THE INVENTION

Technical Field of the Invention

The present invention discloses a two-dimensional (2D) product code for forward error correction (FEC) and a method for detecting false decoding errors in digital communication systems.

Long-distance digital communication systems, such as optical submarine cable systems, are responsible for the transmission of significant amounts of data. This data is transmitted across great distances, often from continent to continent. During transmission, data can become corrupted from noise within transmission channels, faults in transmission or receiving devices, or data errors from reading from and writing to an elastic store. Therefore, FEC is employed to minimize the error probability of transmitted data.

Claude Shannon first suggested a maximum possible channel throughput which developed into a theorem of error correction describing the addition of redundant data to payload data for the correction of errors from channel noise or interference during transmission. This FEC increases the reliability of transmitted data by encoding a block of payload data with redundant data bits through an algorithm generated at the transmitter, which allows a decoder to determine if an error has occurred. The decoder employs the code generated by the encoder to identify what information, if any, has been corrupted by noise or interference during transmission, and the decoder can in turn correct these errors.

As known in the art, FEC can be implemented as a product code. A product code may be two-dimensional (2D), where every bit within the transmission frame is subject to two separate, but intersecting, codes; one row code and one column code. A FEC codeword (n), or block of symbols, is comprised of data bits or information symbols (k) and parity bits or redundant symbols (r). Generally, any errors in long-distance data transmission are uniformly random. Such errors can be remedied by interleaving bits for transmission; therefore, errors are scattered across transmission frames so that de-interleaving the data shows random, individualized errors which are easy to detect and correct.

Presently, prior art teaches the use of cyclical redundancy check (CRC) codes to detect false errors. However, appending CRC parity to the data increases both the overhead and the redundancy of the system. Therefore, it is an object of the present invention to provide a method to detect and correct false errors without the use of CRC codes.

SUMMARY OF THE INVENTION

The present invention discloses a method and apparatus for performing forward error correction with a multi-dimensional product code, and a method for detecting false decoding errors in frame-based data transmission systems. The present invention discloses a 2D product code comprised of two Bose Ray-Chaudhuri Hocquenghem (BCH) codes. BCH codes are cyclic, error-correcting, digital codes of variable lengths which are able to correct errors in transmitted data. BCH codes typically employ a polynomial over a finite field, and a BCH codeword consists of a polynomial that is a multiple of the generator polynomial. Transmitted data is input into decoder which contains a syndrome to process each code and determine if any errors exist. The syndrome sends the data to a buffer and concurrently, through the use of a 2D BCH product code, sends the data through both a row decoder and a column decoder. Employing such iterative decoding allows the row decoder to correct any remaining errors not corrected by the column decoder, and/or allows the column decoder to correct any remaining errors not corrected by the row decoder. In addition, the row codes may correct all column code data and parity, and the column codes may correct all row code data and parity. Once the data has been fully decoded, or the row decoder and/or the column decoder have been stopped, the detected errors from the decoders and the data from the buffer are passed to the error correction element to correct data using the supplied error information.

Due to the limited amount of redundant information the decoder can sometimes detect errors incorrectly; in the present invention, such invalid errors are known as false errors. To maximize the efficiency of FEC, the present invention provides a method to detect such false errors. By ensuring that the BCH codewords are shortened from one or more substantially larger parent codewords(s), the presence of any errors detected beyond the parameters of the shortened codeword, i.e. within the set of data constants, signify that all detected errors are invalid; therefore the decoder is prevented from correcting such false errors.

DESCRIPTION OF THE DRAWINGS

FIG. 1 illustrates a conceptual view of a data matrix utilized by the present invention, as known in the art.

FIG. 2 illustrates a conceptual view of a data matrix, in accordance with an illustrative embodiment of the present invention.

FIG. 3 is a block diagram illustrating the transmission of data rows, in accordance with an illustrative embodiment of the present invention.

DETAILED DESCRIPTION OF THE PRESENT INVENTION

Figure 1A:
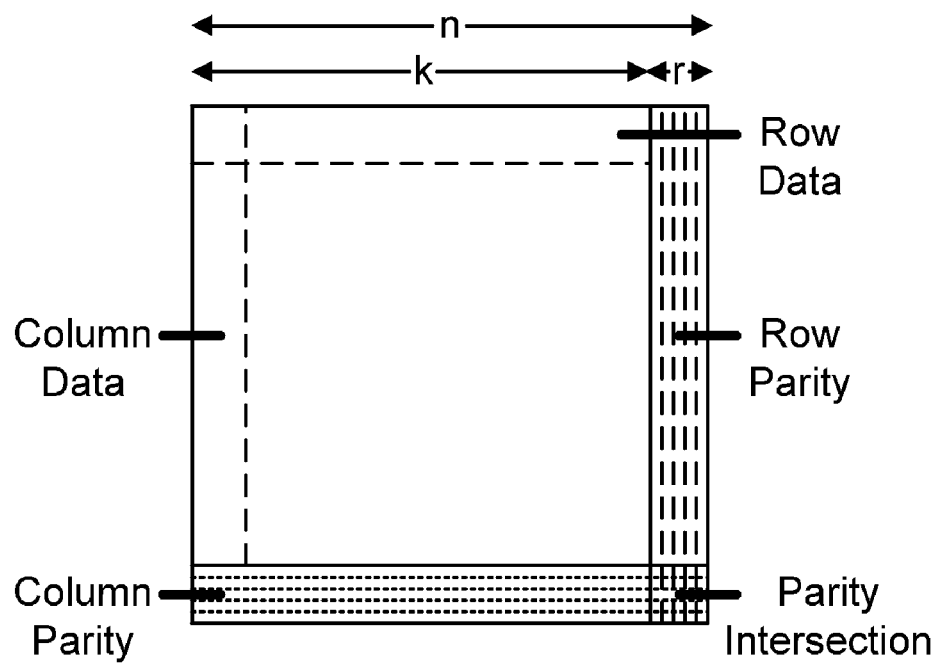
FIG. 1(a) illustrates a conceptual view of a data matrix utilized by the present invention, as known in the art.
Figure 1B:
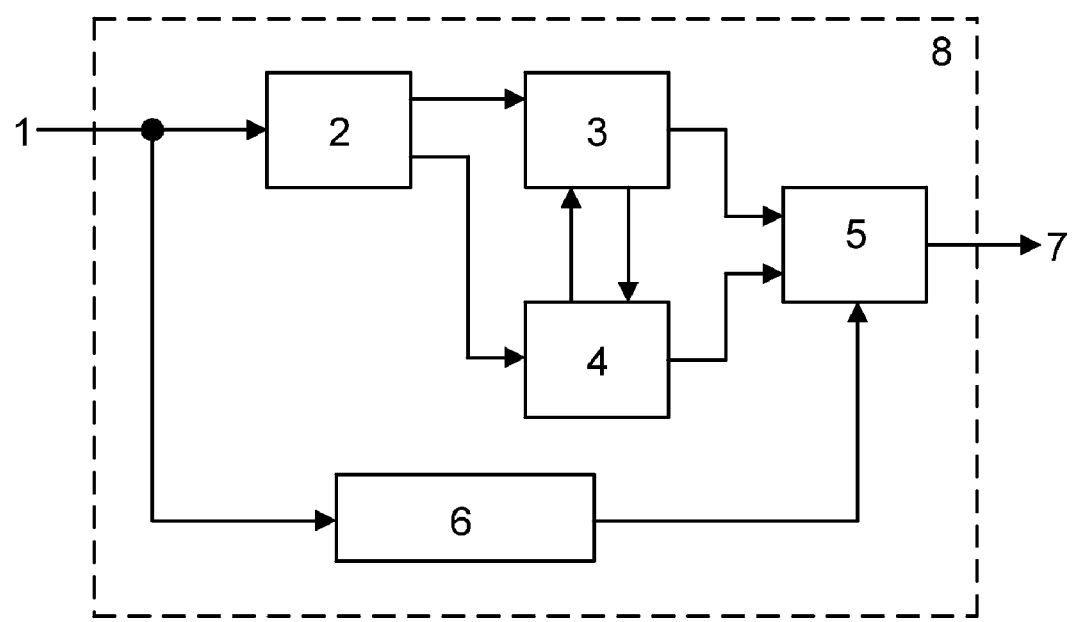
FIG. 1(b) is a block diagram illustrating data decoding and error correction, in accordance with an illustrative embodiment of the present invention.

The present invention discloses a 2D product code for FEC in high-speed data transmission systems. The present invention is comprised of two interleaved BCH codes, concatenated to provide a high-performance, efficient algorithm. FIG. 1 illustrates the conceptual view of the data matrix utilized by the present invention, as is known in the art; as shown, the frame comprises x row codes and y column codes. Each bit located within the frame, such as within bit location 1, is subject to both the x row code and the y column code.

As further illustrated by FIG. 1(*a*) the data matrix is comprised of row and column codewords; each codeword n contains k data bits and r parity bits. The 2D data matrix is constructed as a row encoder processes and encodes the k data bits, appending the r parity bits to the data rows. Likewise, a column encoder processes and encodes the k data bits, appending the r parity bits to the data columns. It should be noted that the encoding process can be performed with the rows encoded, followed by the columns encoded, or the encoding process can be performed with the columns encoded, followed by the rows encoded. As illustrated, a section of the data matrix exists where the row parity bits and the column parity bits intersect; here, the row encoder can compute the column parity and append the information into the parity intersection position, or, similarly, the column encoder can compute the row parity and append the information into the parity intersection position. Due to orthogonal mapping the parity value calculated over the row parity is equal to the parity value calculated over the column parity.

The error correction process is shown in FIG. 1(*b*), which illustrates the 2D product code as decoded using an iterative approach. Data is transmitted row by row to ensure the transmitted data is bit-wise interleaved when data is input (1) into decoder (8). For example, data may be transmitted as data frames. As shown, the data is written into syndrome (2), which processes each code and determines whether or not an error exists in each code. The data is then transmitted from syndrome (2) to row decoder (3), which decodes the data and subsequently transmits the data to column decoder (4), which continues to decode the data. It should be noted that the decoding process can begin with either set of codes—row codes decoded, followed by column codes decoded, or with column codes decoded, followed by row codes decoded— provided that one group of codes follows the other group of codes. The data may be passed back and forth between row decoder (3) and column decoder (4) until all the data is decoded or a stop condition occurs. Once each of the codes has been fully decoded, or the row decoder (3) and/or the column decoder (4) have been stopped, the detected errors and the data from the buffer (6) are passed to the error correction element (5). The error correction element (5) corrects the data using the supplied error information and the data is subsequently transmitted out of the system (7). For example, the error correction element (5) may compare data from the row decoder (3) and/or column decoder (4) with data from the buffer (6) and correct any errors in the data.

Figure 4:
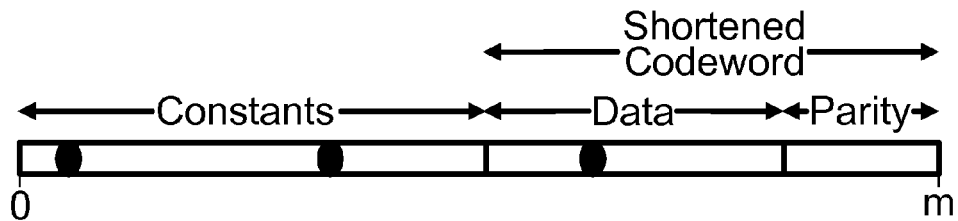
FIG. 4 is a block diagram illustrating the detection of false errors, in accordance with an illustrative embodiment of the present invention.
Figure 4:
Figure 5:
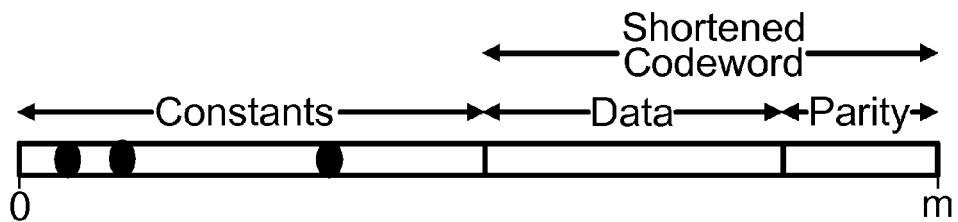
FIG. 5 is a block diagram illustrating the detection of false errors, in accordance with an illustrative embodiment of the present invention.
Figure 5:
Figure 6:
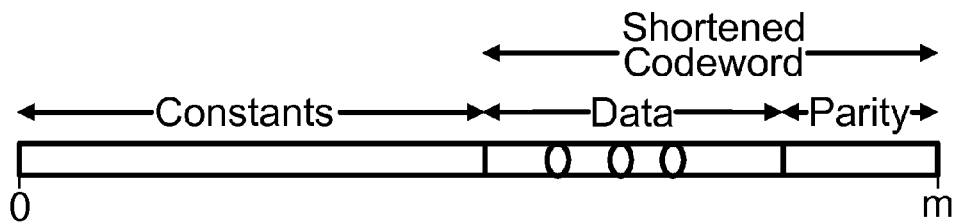
FIG. 6 is a block diagram illustrating the detection of legitimate errors, in accordance with an illustrative embodiment of the present invention.
Figure 6:
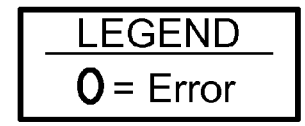

The present invention operates with a large GF, such that m is large enough to ensure the maximum code length of the parent code (2m−1) is sufficiently larger than the shortened codeword length. For example, FIG. 4 illustrates a codeword operating on a GF with 0 to m elements. As shown, beyond the shortened codeword and parity bits, a series of data constants, i.e., a series of 0 values, are used to occupy the remaining elements within the 0 to m elements. For explanatory purposes the shortened codeword illustrated is subject to an m value large enough to cover 30% of the codeword and operates with a t=3 value, where t=the number of errors that can be corrected within a row code or a column code. It should be noted that this example is provided for illustrative purposes only and is not meant to limit the scope of the invention, as other m values and t values may be accommodated. As illustrated in FIG. 4, three errors are detected; while one of these errors is located within the range of the shortened codeword, two of the errors are located outside this range, thus the errors are determined to be false errors. As further illustrated in FIG. 5, where all three errors are located outside the shortened codeword range, they are similarly determined to be false errors. For legitimate errors to occur, all three errors must be located within the range of the shortened codeword, as illustrated in FIG. 6. By providing a large m value the present invention ensures the maximum parent code length of (2m−1) is sufficiently larger than the shortened codeword length; thus the decoders are able to detect and ignore false errors, thereby increasing the code's error correction and error detection capability.

DETAILED DESCRIPTION OF AN ILLUSTRATIVE EMBODIMENT OF THE PRESENT INVENTION

Figure 7:
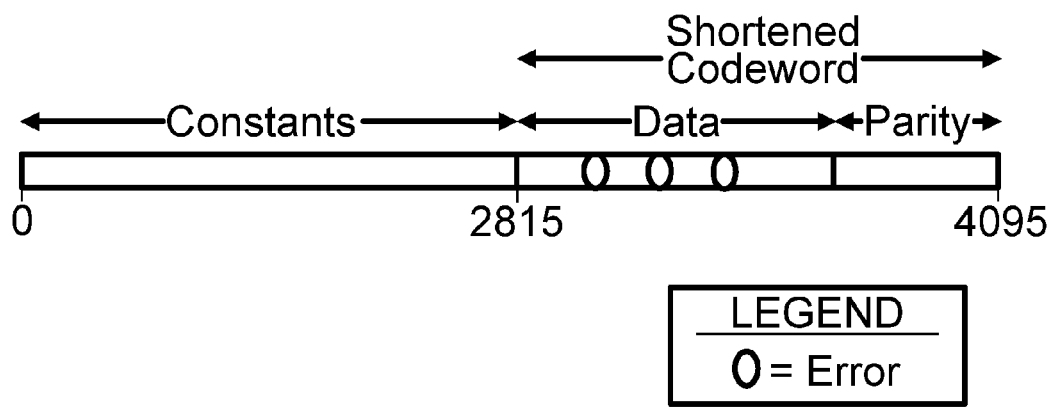
FIG. 7 is a block diagram illustrating the detection of legitimate errors, in accordance with an illustrative embodiment of the present invention.
Figure 8:
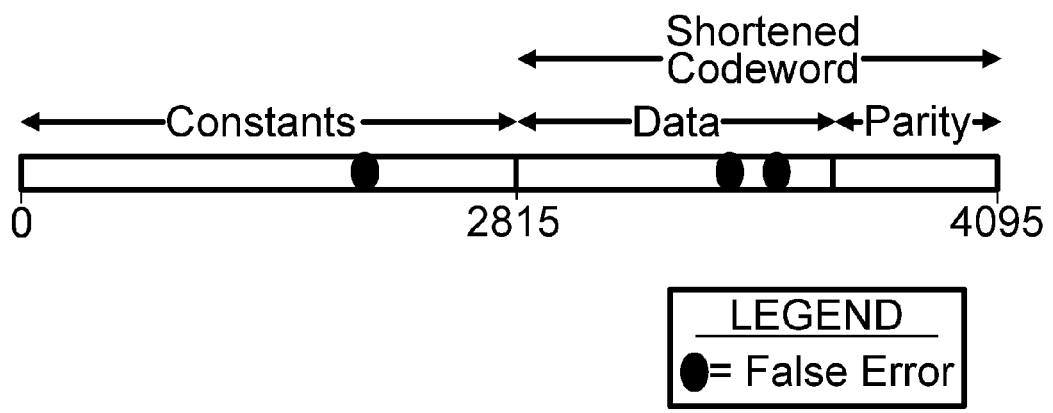
FIG. 8 is a block diagram illustrating the detection of false errors, in accordance with an illustrative embodiment of the present invention.

An illustrative embodiment of the present invention, as illustrated in FIG. 2, employs a 2D product code comprising 1280 row codes and 1020 column codes. In the illustrative embodiment, the present invention employs a GF with m=12 and operates with the polynomial $p(x)=x^{12}+x^6+x^4+x+1$. The row codes are implemented as BCH (1280, 1244) and the column codes are implemented as BCH (1020, 984). Both the row codes and the column codes are shortened from a BCH (4095, 4059) parent code. The illustrative embodiment operates with t=3, allowing for three errors to be corrected within each codeword. The BCH (1280, 1244) row codes and BCH (1020, 984) column codes are interleaved to produce the 2D product code, and the 2D product code is transmitted row by row as illustrated in FIG. 3, with the column codes bit-interleaved within. As illustrated in FIG. 7, the codeword elements range from 0 to 4095, as the GF operates with m=12, i.e., GF ($2^m$), which contains 4096 elements. As t=3, up to three errors may be corrected per codeword. The BCH (1280, 1244) row code covers approximately 30% of the codeword length and the decoder corrects the three legitimate errors found in this area. As illustrated in FIG. 8, if any errors are detected outside the codeword's shortened BCH (1280, 1244) length, all errors, both outside the range of the shortened codeword and inside the range of the shortened codeword are determined to be false errors. Where any errors are detected within the codeword but outside the range of the shortened codeword length, the errors are determined to be false errors, as the product code is only valid for the parameter of the shortened code length. In the present invention, an algorithm will detect any errors occurring outside the valid codeword parameter, but the decoder will recognize these errors as false errors, for legitimate errors cannot occur within the range of constant values, i.e., outside the range of the shortened codeword.

The invention claimed is:

1. An apparatus for forward error correction, the apparatus comprising: circuitry operable to receive a data frame, wherein a multi-dimensional product code, comprising a first error-correcting code and a second error-correcting code, has been applied to the data frame, and wherein the first error-correcting code has been applied to a plurality of rows of the data frame as an error-correcting row code, and the second error-correcting code has been applied to a plurality of columns of the data frame as an error-correcting column code; a decoder, operable to iteratively decode the received data frame, comprising: a syndrome operable to: determine existence of errors in the received data frame, and transmit the received data frame to a storage element, and a first internal decoder and a second internal decoder operable to decode the received data frame based on a determination of existence of errors by the syndrome, wherein the first internal decoder and the second internal decoder iteratively decode the received data frame and generate decoding data; and an error correction element, wherein the error correction element is operable to: compare the decoding data received from the first decoder with the data frame received from the storage element, and correct errors in the data frame.

2. The apparatus of claim 1, wherein said multi-dimensional product code is comprised of a first Bose Ray-Chaudhuri Hocquenghem (BCH) code and a second BCH code.

3. The apparatus of claim 2, wherein said first BCH code is BCH (1280, 1244), shortened from parent code BCH (4095, 4059).

4. The apparatus of claim 2, wherein said second BCH code is BCH (1020, 984), shortened from parent code BCH (4095, 4059).

5. The apparatus of claim 2, wherein said first BCH code and said second BCH code are interleaved to produce said multi-dimensional product code for forward error correction.

6. The apparatus of claim 5, wherein said multi-dimensional product code is transmitted row-by-row with said error correcting column code interleaved within each of said plurality of rows.

7. The apparatus of claim 1, wherein the decoder is further operable to:
    generate, at the first internal decoder, first decoding data corresponding to the received data frame;
    transmit the first decoding data, from the first internal decoder, to the second internal decoder; and
    generate, at the second internal decoder, second decoding data corresponding to the received data frame and the first decoding data.

8. The apparatus of claim 7 further comprising:
    transmit the second decoding data, from the second internal decoder, to the first internal decoder; and
    generate, at the first internal decoder, third decoding data corresponding to the received data frame and the second decoding data.

9. The apparatus of claim 1, wherein the decoder iteratively decodes the received data frame until a stop condition occurs.

10. A method of forward error correction, the method comprising: receiving a data frame, wherein: a multi-dimensional product code comprising a first error-correcting code and a second error-correcting code has been applied to the data frame; the first error-correcting code has been applied to a plurality of rows of the data frame as an error-correcting row code; the second error-correcting code has been applied to a plurality of columns of the data frame as an error-correcting column code; determining errors, using a syndrome, in the received data frame; transmitting, from the syndrome, the received data frame to a storage element; iteratively decoding the received data frame, based on the determination by the syndrome, using a decoder comprising a first internal decoder and a second internal decoder; generating, using the decoder, decoding data; correcting the received data frame, using an error correction element, wherein the error correction element is operable to: compare the decoding data received from the first decoder with the data frame received from the storage element, and correct errors in the data frame.

11. The method of claim 10, wherein said multi-dimensional product code is comprised of a first Bose Ray-Chaudhuri Hocquenghem (BCH) code and a second BCH code.

12. The method of claim 11, wherein said first BCH code is BCH (1280, 1244), shortened from parent code BCH (4095, 4059).

13. The method of claim 11, wherein said second BCH code is BCH (1020, 984), shortened from parent code BCH (4095, 4059).

14. The method of claim 11, wherein said first BCH code and said second BCH code are interleaved to produce said multi-dimensional product code for forward error correction.

15. The method of claim 14, wherein said multi-dimensional product code is transmitted row-by-row with said error correcting column code interleaved within each of said plurality of rows.

16. The method of claim 10, wherein the iteratively decoding further comprises: generating, at the first internal decoder, first decoding data corresponding to the received data frame; transmitting the first decoding data, from the first internal decoder, to the second internal decoder; and generating, at the second internal decoder, second decoding data corresponding to the received data frame and the first decoding data.

17. The method of claim 16 further comprising: transmitting the second decoding data, from the second internal decoder, to the first internal decoder;
    and generating, at the first internal decoder, third decoding data corresponding to the received data frame and the second decoding data.

18. The method of claim 10, wherein the decoder iteratively decodes the received data frame until a stop condition occurs.

19. A programmable circuit for forward error correction, the programmable circuit comprising: circuitry operable to receive a data frame, wherein: a multi-dimensional product code, comprising a first error-correcting code and a second error-correcting code, has been applied to the data frame, and wherein the first error-correcting code has been applied to a plurality of rows of the data frame as an error-correcting row code, and the second error-correcting code has been applied to a plurality of columns of the data frame as an error-correcting column code; a decoder, operable to iteratively decode the received data frame, comprising: a syndrome operable to determine existence of errors in the received data frame, and a first internal decoder and a second internal decoder operable to decode the received data frame based on a determination of existence of errors by the syndrome, wherein the first internal decoder and the second internal decoder iteratively decode the received data frame and generate decoding data; and an error correction element, wherein the error correction element is operable to: compare the decoding data received from the first decoder with the received data frame and, correct errors in the data frame.

20. The circuit of claim 19, wherein the decoder is further operable to: generate, at the first internal decoder, first decoding data corresponding to the received data frame; transmit the first decoding data, from the first internal decoder, to the second internal decoder; and generate, at the second internal decoder, second decoding data corresponding to the received data frame and the first decoding data.

* * * * *